United States Patent [19]

Maeno

[11] Patent Number: 4,914,379

[45] Date of Patent: Apr. 3, 1990

[54] SEMICONDUCTOR INTEGRATED CIRCUIT AND METHOD OF TESTING SAME

[75] Inventor: Hideshi Maeno, Itami, Japan

[73] Assignee: Mitsubishi Denki Kabushiki Kaisha, Tokyo, Japan

[21] Appl. No.: 341,561

[22] Filed: Apr. 20, 1989

[51] Int. Cl.⁴ ............................................. G01R 31/28
[52] U.S. Cl. .................................. 371/22.3; 371/22.5; 324/73.1
[58] Field of Search ........................ 324/73 R, 73 AT; 371/25.1, 22.3

[56] References Cited

U.S. PATENT DOCUMENTS

| | | | |
|---|---|---|---|
| 4,267,463 | 5/1981 | Mayumi | 324/73 R |
| 4,503,537 | 3/1985 | McAnney | 371/22.3 |
| 4,513,418 | 4/1985 | Bardell, Jr. et al. | 371/22.3 |
| 4,534,028 | 8/1985 | Trischler | 324/73 R |

Primary Examiner—Ernest F. Karlsen
Attorney, Agent, or Firm—Thomas R. Morrison

[57] ABSTRACT

A semiconductor integrated circuit for use in, for example, computers, electronic control systems and the like, is provided. The integrated circuit contains a plurality of tested circuits which need be tested, prior to actual use, as to whether they can perform their assigned logic functions. A pair of shift registers are connected to the input and output of each tested circuit, respectively. An externally applied selection signal selects only one pair of shift registers at a time so that a particular tested circuit is specified and the application of a test signal and the derivation of a test result to and from the specified tested circuit become possible. The structure and testing method enables reduction of the number of clock signals required for testing and, hence, the number of clock signal input terminals on the integrated circuit.

8 Claims, 9 Drawing Sheets

SEMICONDUCTOR INTEGRATED CIRCUIT AND METHOD OF TESTING SAME

The present invention relates to a semiconductor integrated circuit and also a method of testing the semiconductor integrated circuit as to whether it can perform its assigned logic operations. More particularly, the present invention relates to a semiconductor integrated circuit containing a plurality of circuit blocks which may have to be tested as to if they can perform their logic functions, and also to a method of testing such circuit blocks.

BACKGROUND OF THE INVENTION

Usually, electronic systems such as computers and electronic control systems include a number of semiconductor integrated circuits which include a plurality of logic circuit blocks. Prior to or during the actual use of such systems, the logic circuit blocks may have to be tested as to whether they can perform their assigned logic functions. Hereinafter, such test is referred to as "logic test". When a number of circuit blocks have to be subjected to "logic tests", it will be disadvantageously necessary to use a large-scale computer for performing the logic tests, and programs for the tests should be complicated ones.

In order to solve such problems, integrated circuits which can be easily tested have been proposed. They include shift registers (or "scan-paths") therein, as shown in an article "APPLICATION OF SHIFT REGISTER APPROACH AND ITS EFFECTIVE IMPLEMENTATION" by M. Kawai et al in 1980 *IEEE Test Conference Proceedings Paper* 2.2, pages 22–25. The designing concept of such integrated circuits is based on modifying sequential circuitry into a combination of a plurality of smaller logic circuit blocks by means of shift registers, with such logic blocks being formed as being testable.

The use of such "scan-paths" has eliminated the aforementioned problems accompanying the logic tests of integrated circuits or even relatively large-scale integrated circuits. However, when this technique of dividing a sequential circuit into a plurality of smaller circuit blocks is employed, as the number of the divided logic circuit blocks increases, the number of clock signals for driving the scan-paths also increases, which, in turn, makes it necessary to increase the number of input terminals on the integrated circuit for the externally applied clock signals. This causes an integrated circuit package to become bulky, which may raise the cost of the integrated circuts. In some cases, it will be impossible to realize practical integrated circuits.

Accordingly, an object of the present invention is to eliminate the above-stated problem, by providing a novel semiconductor integrated circuit and a novel method of testing it, which can eliminate the need for increasing the number of the input terminals for receiving externally applied clock signals for use in testing circuit blocks, the number of which clock signals must be increased when the number of the circuit blocks increases.

Other objects, features and results of the present invention will become clear from the accompanying claims and the following detailed description of the invention.

SUMMARY OF THE INVENTION

The semiconductor integrated circuit (IC) according to the present invention comprises a plurality of circuits (hereinafter referred to as tested circuits) which are subjected to logic tests, a plurality of shift register means connected to respective ones of said tested circuits at their input sides and responsive to clock signals externally applied thereto for coupling externally applied test signals to associated tested circuits and a plurality of shift register means connected to the respective ones of said tested circuits at their respective output sides and responsive to externally applied clock signals for deriving signals representative of test results. The shift register means connected to the input side of one tested circuit and the shift register means connected to the output of that one shift register means form a pair. The semiconductor IC of the present invention further comprises selection signal input means for receiving an externally applied selection signal which designates or selects one of said pairs of shift register means to which the clock signal is to be coupled, and means responsive to said selection signal for selectively coupling the externally applied clock signals to one of said pairs of shift register means selected by said selection signal.

According to the present invention, provided is a method for testing a semiconductor IC which comprises a plurality of tested circuits which are subject to the logic tests and a plurality of shift register means connected to respective ones of the plurality of tested circuits and responsive to externally applied clock signals for coupling externally applied test signals to and deriving test result-representative signals from the tested circuits to which they are connected. The method comprises steps of applying a shift register selection signal for selecting the shift register means connected to a particular circuit to be tested; applying predetermined clock signals and test data signals to the selected shift register means for testing said particular circuit to be tested; and reading the results of the test.

DETAILED DESCRIPTION OF THE INVENTION

Figure 1:
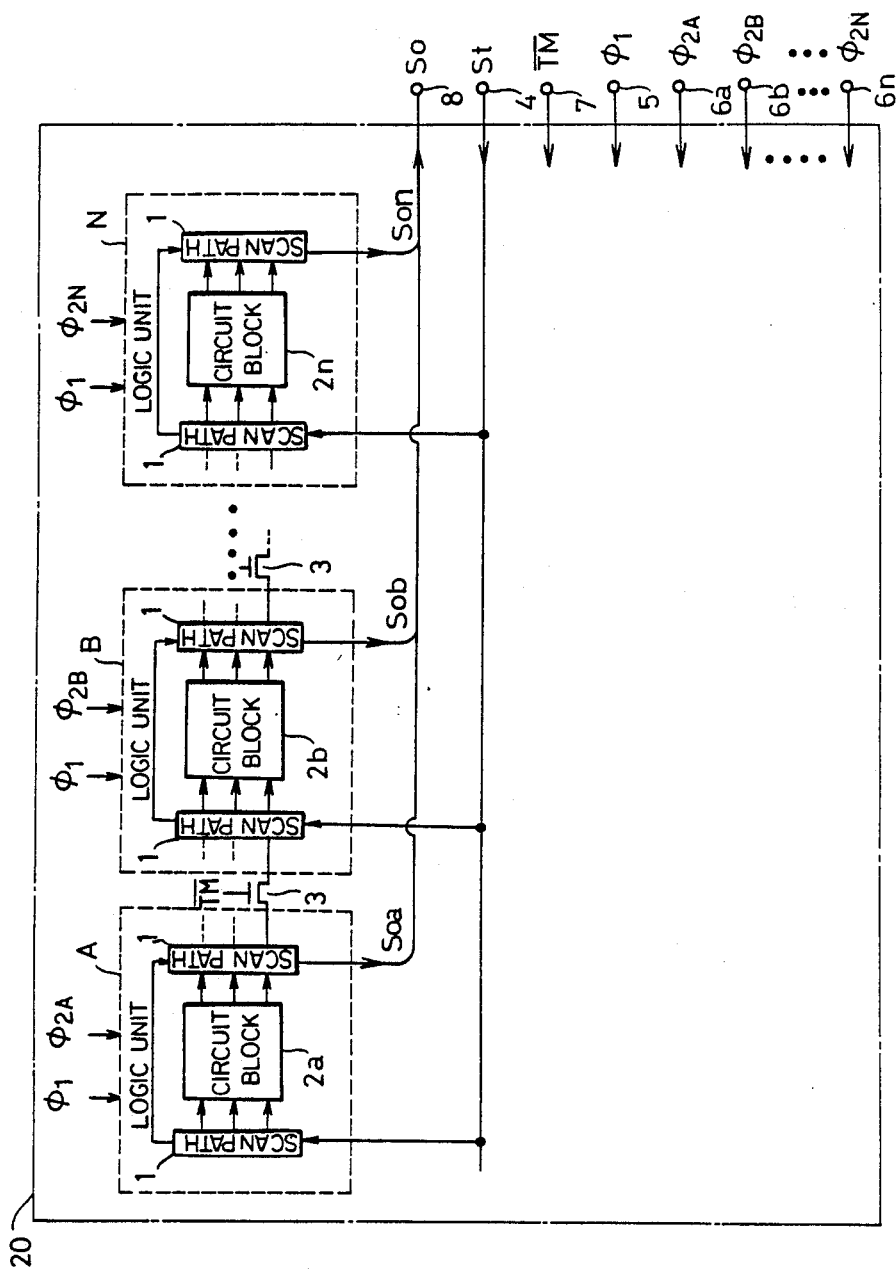
FIG. 1 is a block diagram of an example of a conventional semiconductor IC which includes a plurality of circuits to be tested and the logic test of which can be done through the use of scan-paths.

Now, referring to the accompanying drawings, the present invention is described, contrasting it to prior art. It should be noted that the same reference numerals and symbols are used for the same component and signals throughout the drawings.

FIG. 1 is a block diagram showing a conventional semiconductor integrated circuit (IC) 20 which includes a plurality of logic circuit blocks (tested circuits) to be subjected to logic test.

In FIG. 1, the semiconductor IC 20 includes a plurality of logic units A, B, . . . , N. Each of the logic units includes a circuit block 2a (2b, 2c, . . . , 2n) which is a circuit to be tested, and a pair of scan-paths 1. It is to be noted that throughout the specification and drawings, the letters A, B, . . . , N and a, b, . . . , n attached to circuits, paths, signals, etc. mean that they belong to the respective units having corresponding letters.

Each of the circuit blocks 2a–2n includes parallel input terminals connected to the scan-path 1 on the input side of that block, and parallel output terminals connected to the scan-path 1 on the output side. The scan-path 1 connected to the input of each of the circuit blocks is connected to receive a test data signal $S_t$ from a serial input terminal 4, while the scan-path 1 connected to the output of each circuit block is connected to provide a data signal $S_o$ ($S_{oa}$, $S_{ob}$, . . . , $S_{on}$) to a serial output terminal 8.

Clock signals $\phi_1$, $\phi_{2A}$, $\phi_{2B}$, . . . , $\phi_{2N}$, are applied to clock input terminals 5, 6a, 6b, . . . , 6n, respectively. The scan-paths 1 connected to the circuit block 2a are connected to receive the clock signals $\phi_1$ and $\phi_{2A}$. The scan-paths 1 connected to the circuit block 2b are connected to receive the clock signals $\phi_1$ and $\phi_{2B}$. Similarly, the scan-paths 1 connected to the circuit block 2n are connected to receive the clock signals $\phi_1$ and $\phi_{2N}$.

In the illustrated example, one or more switching transistors 3 are connected between the output side scan-path 1 of one circuit block, e.g. 2a, and the input side scan-path 1 of the adjacent circuit block, e.g. 2b, so as to provide between these adjacent scan-paths one or more signal paths which can be selectively opened or closed. The switching transistors 3 are used for switching the circuit connections between the normal operation mode and the test operation mode of the IC 20. Any type of transistors, such as P or N channel insulated gate field effect transistors and bipolar transistors, can be used as the switching transistors 3. The illustrated example is described as employing N channel insulated gate field effect transistors as the switching transistors 3. When the circuit block 2a is to be tested, the gate of each switching transistor 3 associated with the circuit block 2a is connected to receive a test mode signal $\overline{TM}$ at a low level indicating the test mode, externally applied via a test mode control terminal 7. The transistors 3 are rendered nonconductive during the test mode of operation in response to the test mode signal $\overline{TM}$.

Figure 2:
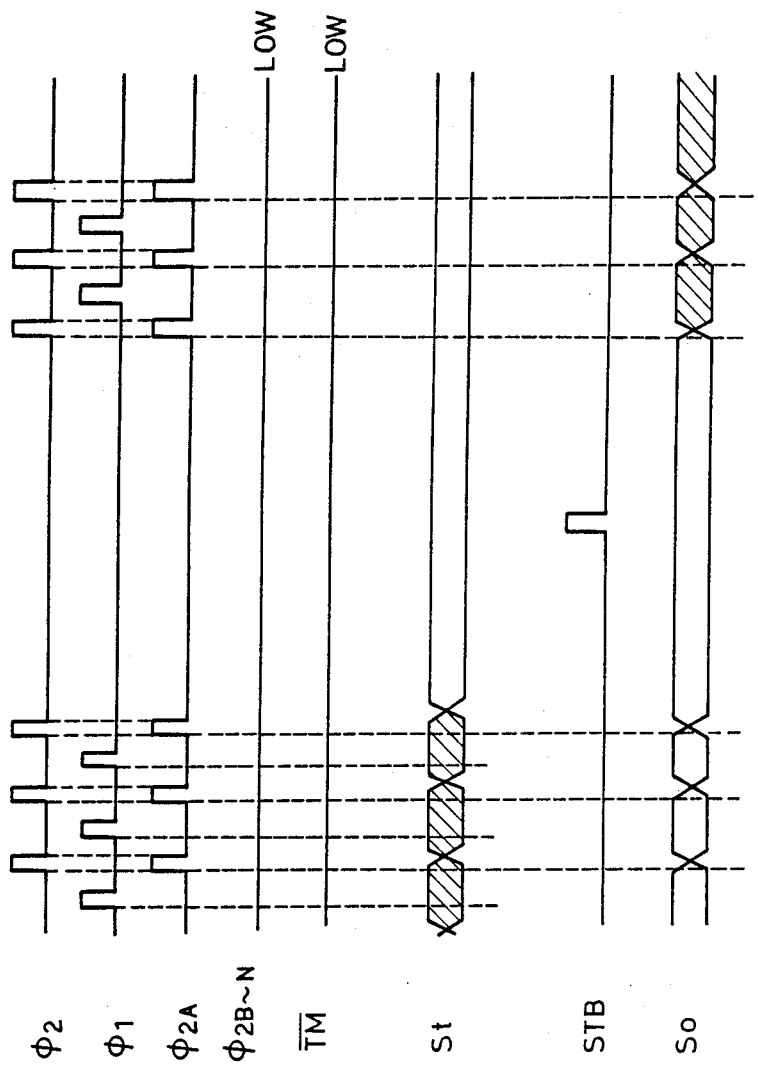
FIG. 2 shows waveforms indicating timings of various signals for helping understanding of test and normal modes of operation of the semiconductor IC of FIG. 1.

Now, the operation of the above-stated circuit is described with reference to the waveforms shown in FIG. 2.

Since the circuit blocks 2a though 2n are provided with the scan-paths connected to their input and output terminals, each of them can be tested independent of the remaining circuit blocks.

Now, the testing of the circuit block 2a in the test mode is described as an example. First, the clock signals $\phi_1$ and $\phi_{2A}$ are applied to the scan-paths 1 connected to the input and output sides of he circuit block 2a, while the test data (drive data signal $S_t$ for testing the block 2a is serially applied through the serial input terminal 4 to the input side scan-path 1 so as to apply the test data in a parallel form to the circuit block 2a. Upon receipt of the test data, the circuit block 2a performs logic operation and provides test-result representing parallel data to the output side scan-path 1. Upon receipt of this test-result, the output side scan-path converts it into serial data and applies it to the serial output terminal 8. During the described operation, the signals $\overline{TM}$, $\phi_{2B}$, . . . , $\phi_{2N}$ remain at a low level so that the switching transistors 3 are nonconductive and the scan-paths 1 associated with the units B, . . . , N are disabled. A similar test can be provided for each of the remaining circuit blocks 2b, . . . , 2n.

During the normal mode of operation, the clocks signals $\phi_1$, $\phi_{2A}$, . . . , $\phi_{2N}$ are at the low level, the test data signal $S_t$ is not present, and the test mode signal $\overline{TM}$ at the high level is applied to the gates of the transistors 3 to turn on the transistors 3. This causes the circuit block 2a to provide one or more output signals, depending on the function assigned to the circuit block 2a, to the circuit block 2b. Thus, the desired circuit blocks are connected with one another, and the desired operation of the semiconductor IC is performed.

Figure 3:
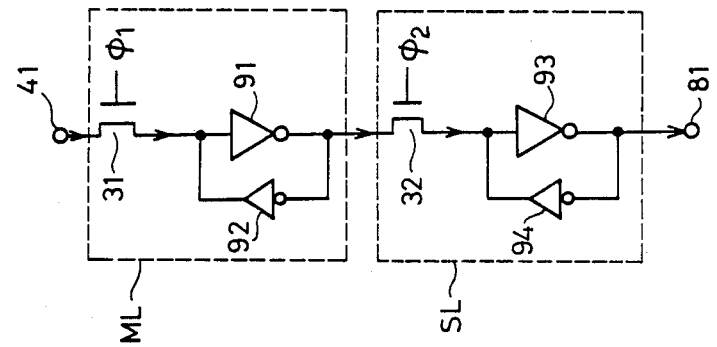
FIG. 3 shows the arrangement of one example of a shift register usuable in a scan-path in the semiconductor IC of FIG. 1.

FIG. 3 is a circuit diagram of an example of a shift register that can be used in the scan-paths shown in FIG. 1.

The shift register shown in FIG. 3 comprises a series combination of an N channel insulated gate field effect transistor (IGFET) 31, a master latch circuit ML formed of inverters 91 and 92, an N channel IFGET 32 and a slave latch SL formed of inverters 93 and 94. The series combination is connected between an input terminal 41 and an output terminal 81. The master and slave latch circuits ML and SL are ratio-type latch circuits comprising two inverters (91 and 92, and 93 and 94) having different driving capabilitites. The ratio-type latch circuit is formed by connecting the input of the inverter with larger driving capability as the input of the latch circuit and connecting the output of the larger driving capability inverter as the output of the latch circuit, with the input and output of the inverter with smaller driving capability being connected to the output and input of the latch circuit, respectively. Since the ratio-type latch circuit is a small scale circuit and can perform static operation, it is advantaageously employed in MOS semiconductor integrated circuits.

Next, the operation of the shift register of FIG. 3 is described.

It never happens that both of clock signals $\phi_1$ and $\phi_2$ are at the high level. The master latch circuit ML is responsive to the clock signal $\phi_1$ to store the data signal applied through the serial input terminal 41. After that, the slave latch circuit SL responds to the clock signal $\phi_2$ by storing the data signal stored in the master latch circuit ML and providing it at the serial output terminal 81.

Generally, a scan-path comprises a series combination of a plurality of such shift registers. Each of the shift registers is provided with an input terminal and an output terminal. The input terminals of the shift registers receive parallel input signals, and the output terminals of the shift registers provide parallel output signals.

The shift register does not perform shifting operation if it is provided with only one of the clock signals $\phi_1$ and $\phi_2$. Accordingly, one ($\phi_1$ in the illustrated example) of such clock signals can be applied in common to the respective scan-paths. However, when the same clock signal $\phi_1$ is applied to the respective scan-paths, and if the same clock signal, additionally, is used in place of the clock signals $\phi_{2A}, \ldots, \phi_{2N}$, drive data for the same test is applied to the remaining scan-paths when a particular one of the circuit blocks 2a through 2n is tested, which may disadvantageously cause damage or degradation of components included in such remaining circut blocks. Accordingly, it is so arranged that only corresponding one of the clock signals $\phi_{2A}-\phi_{2N}$ is applied to a particular one of the circuit blocks to be tested.

Figure 4:
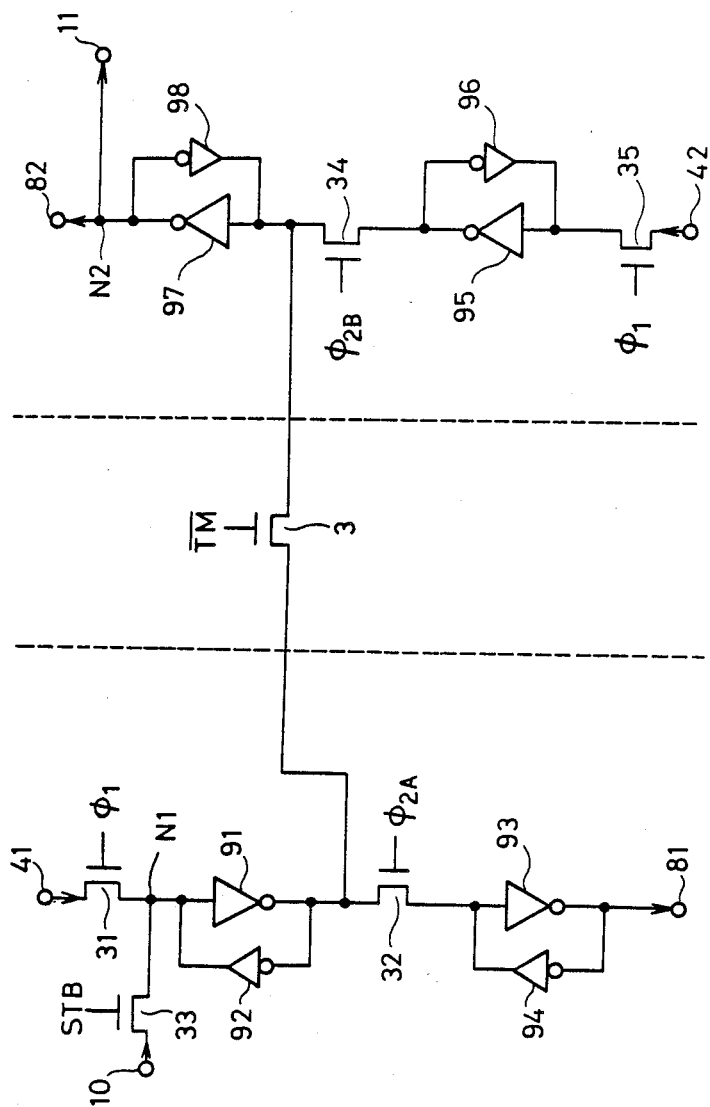
FIG. 4 shows in detail the connection between scanpaths in the semiconductor IC of FIG. 1.

FIG. 4 shows in detail the connection between adjacent scan-paths of FIG. 1.

In FIG. 4, there are shown two shift registers each included in each of scan-paths connected to a switching transistor 3 at its two sides. Both of the shift registers are of a similar circuit configuration to that shown in FIG. 3.

In the test mode of operation, the transistor 3 is turned off in response to the test mode signal $\overline{TM}$ at its low level. The data signal representative of the test result provided by the circuit block 2a is applied to a parallel input terminal 10 and then applied through a transistor 33 to a node N1. The data signal at the node N1 is serially outputted from the serial output terminal 81 through the shifting action provided in response to the clock signals $\phi_1$ and $\phi_{2A}$. A strobe signal STB is applied to the gate of the transistor 33 so as to render it conductive.

The circuit block 2b is connected to a parallel output terminal 11 to receive therefrom serial test drive data inputted in response to the clock signals $\phi_1$ and $\phi_{2B}$.

In the normal mode of operation, the transistor 3 responds to the test mode signal $\overline{TM}$ at its high level by turning on. Also, the transistor 33 turns on in response to the strobe signal STB at its high level. Thus, the parallel input terminal 10 and the parallel output terminal 11 are connected each other through the two latch circuits, whereby the desired circuit connection is provided between the two circuits blocks 2a and 2b. In this case, however, it is necessary to prevent the clock signals from imparing any adverse affect to the circuit connection. For that purpose, the clock signals $\phi_1$, $\phi_{2A}$ and $\phi_{2B}$ may be set to the low level.

As previously noted, when there are a large number of circuit blocks 2a-2n which are subjected to logic tests in the conventional semiconductor IC 20 shown in FIG. 1, a large number of scan-paths must be used in proportion. This causes increase of the number of clock signals $\phi_{2A}-\phi_{2B}$, which in turn causes increase of the number of clock input terminals 6a-6n through which the clock signals are applied. This causes increase in dimensions of packages. Thus, it is impossible to fabricate such semiconductor integrated circuits at a low cost.

Now, the present invention is described in detail by means of embodiments.

Figure 5:
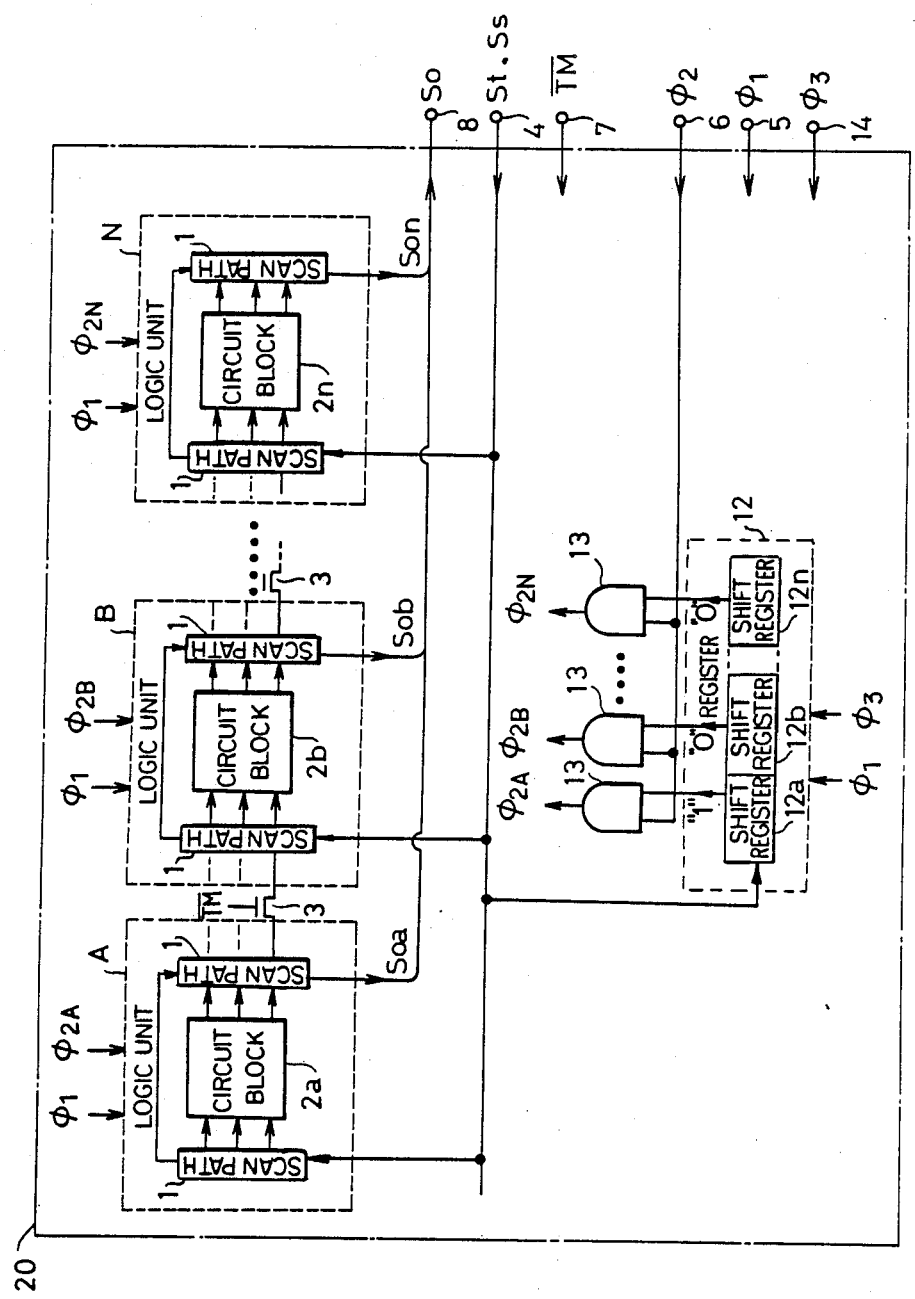
FIG. 5 is a block diagram of a semiconductor IC according to a preferred embodiment of the present invention which includes a plurality of tested circuit blocks subject to logic tests.

FIG. 5 is a block diagram of a semiconductor IC including a plurality of tested circuits subject to logic tests, according to the present invention.

Different from the conventional semiconductor IC shown in FIG. 1, the semiconductor IC 20 shown in FIG. 5 additionally includes a register 12 connected to the serial input terminal 4, and a plurality, N, of AND gates 13 which are connected to outputs of the register 12 and also to a clock input terminal 6. Outputs of the respective ANd gates 13 are connected to corresponding ones of the scan-paths 1. Terminals 5, 6 and 14 are for receiving externally applied clock signals $\phi_1$, $\phi_2$ and $\phi_3$.

The register 12 comprises a series connection of shift registers 12a through 12n corresponding to the circuit blocks 2a through 2n. The clock signals $\phi_1$ and $\phi_3$ which are never at a high level simultaneously with each other (see FIG. 6) are applied to the register 12.

Figure 6:
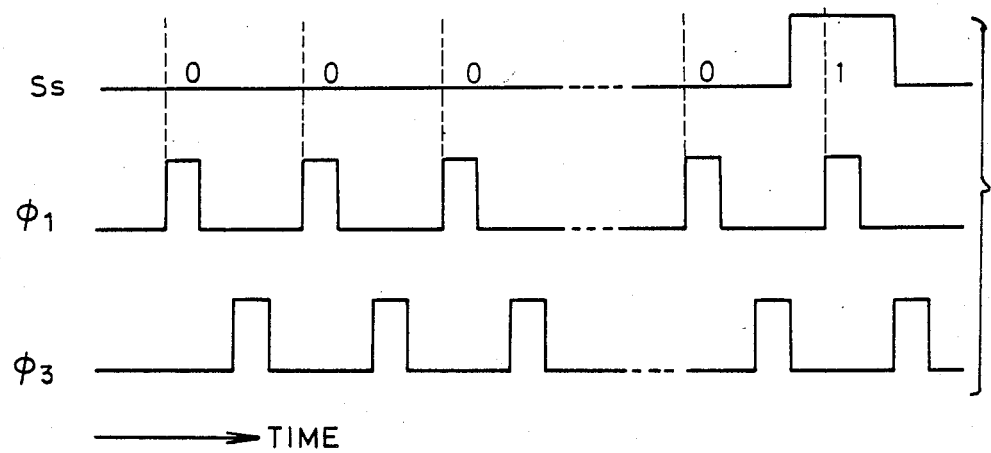
FIG. 6 shows waveforms of signals indicating signal timing for helping understanding of the shift register selecting operation in the semiconductor IC of the present invention of FIG. 5.

In operation, during the test mode of operation, a signal is applied to the register 12 to selects the scan-paths 1 to which the clock signal $\phi_2$ is to be applied. More specifically, a selection signal $S_s$ is applied through the serial input terminal 4 to the register 12. The register 12, in response to the clock signals $\phi_1$ and $\phi_3$, shifts the selection signal $S_s$ from the shift register 12a successively to the shift register 12n for storage. For example, when the scan-paths 1 connected to the circuit block 2a must be selected for coupling the clock signal $\phi_2$ only those scan-paths 1 in order to test the circuit block 2a, the selection signal $S_s$ such as shown in FIG. 6 is applied to the register 12 so that the shift register 12a provided a high level voltage "1", while the remaining shift registers provide "0", whereby data "1" is stored in the shift register 12a and data "0" is stored in the remaining shift registers.

After this selecting operation, the clock signal $\phi_3$ is set to a low level and the clock signals $\phi_1$ and $\phi_2$ are applied so that the clock signal $\phi_2$ is applied only to the selected scan-paths 1 as an output of that AND gate 13 to which both of the "1" output from the register 12 and the clock signal $\phi_2$ are applied. Thus, the test data signal $S_t$ is coupled to the selected circuit block. In this embodiment, the clock signal $\phi_2$ is applied as the clock signal $\phi_{2A}$ to the scan-paths 1 connected to the circuit block 2a, only. On the other hand, the scan-paths connected to the remaining circuit blocks are provided with the clock signal $\phi_1$ but not the clock signal $\phi_2$, they do not operate. Thus, only the selected scan-paths 1 are selectively operated. After this, the test data signal $S_t$ is applied from the input terminal 4 to the circuit block 2a through the input side scan-path 1. The test result is provided through the output side scan-path 1. This operation is similar to the one already described with reference to FIG. 1.

As is understood from the above description, while the conventional semiconductor IC shown in FIG. 1 requires that the number of the clock input terminals increase with increase in number of the tested circuit blocks, according to the present invention, as exemplified in FIG. 5, the number of the required clock input terminals is only three, namely, the clock input terminals 5, 6 and 14. In other words, even when the number of the circuit blocks to be tested increases, there is no need to increase the number of clock input terminals.

Figure 7:
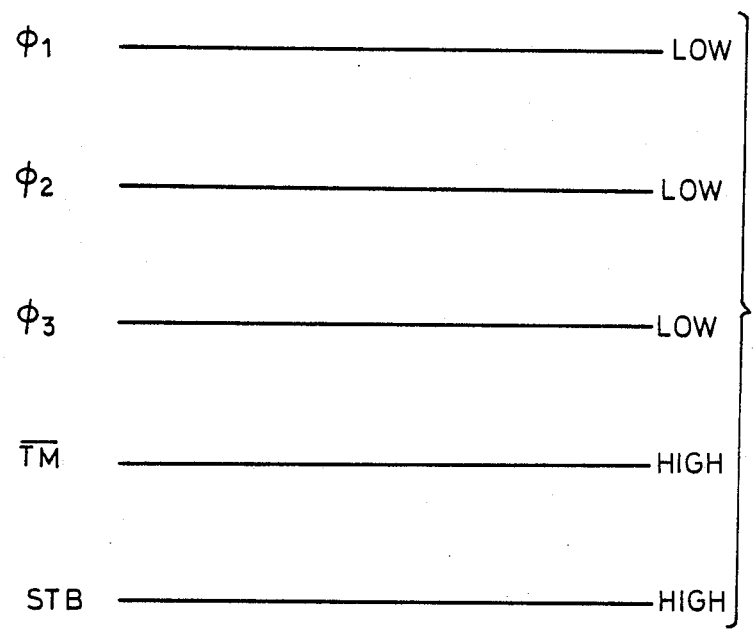
FIG. 7 shows waveforms illustrating relationships among various signals for aiding in understanding a normal mode of operation of the semiconductor IC of the present invention shown in FIG. 5.

Next, during the normal mode of operation, the clock signals $\phi_1$, $\phi_2$ and $\phi_3$ are held at a low level, as shown in FIG. 7, and, therefore, the outputs from the register 12 are "0" and the outputs from the AND gates 13 are at a low level so that the scan-path selection is not done and no test data signal $S_s$ is applied. On the other hand, the test mode signal $\overline{TM}$ and the strobe signal STB are held at a high level. Thus, the desired connections are made between the successive circuit blocks 2a, 2b, ..., 2n, so that the semiconductor IC 20 can perform its normal operation.

Figure 8:
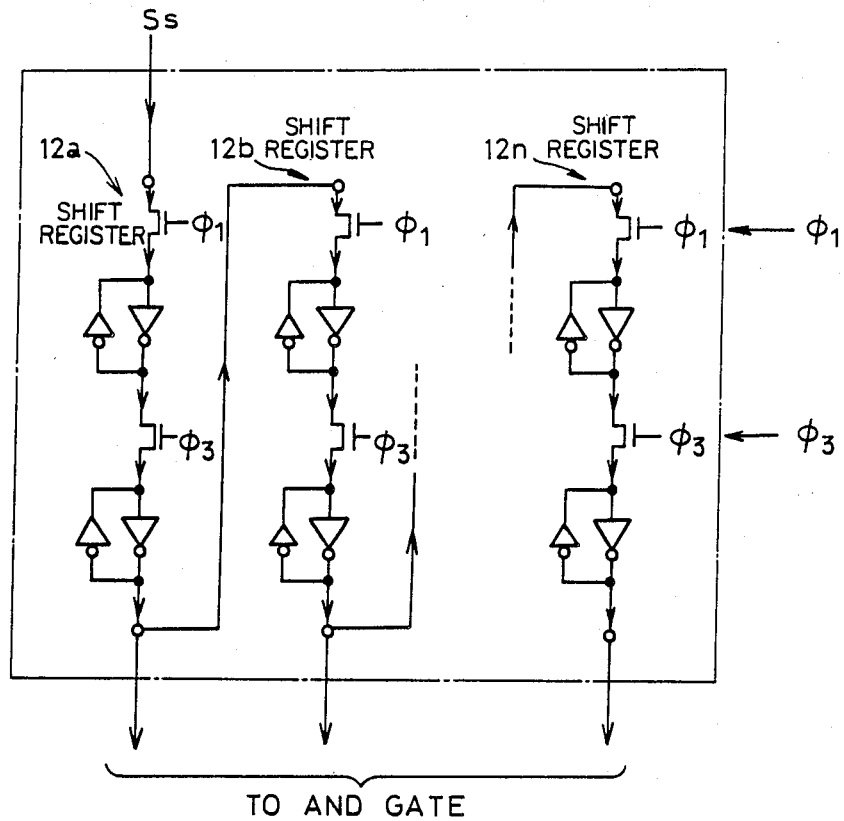
FIG. 8 is a circuit diagram of one example of the register usable in the exemplary semiconductor IC shown in FIG. 5.

FIG. 8 shows an example of the register which can be used in the semiconductor IC shown FIG. 5.

The register 12 shown in FIG. 8 comprises shift registers 12a, 12b, ..., 12n which are connected in series. These shift registers are connected to receive the clock signals $\phi_1$ and $\phi_3$. Operation and configuration of the individual shift registers is similar to that of the shift register shown in FIG. 3, and, therefore, explanation is not made.

Figure 9:
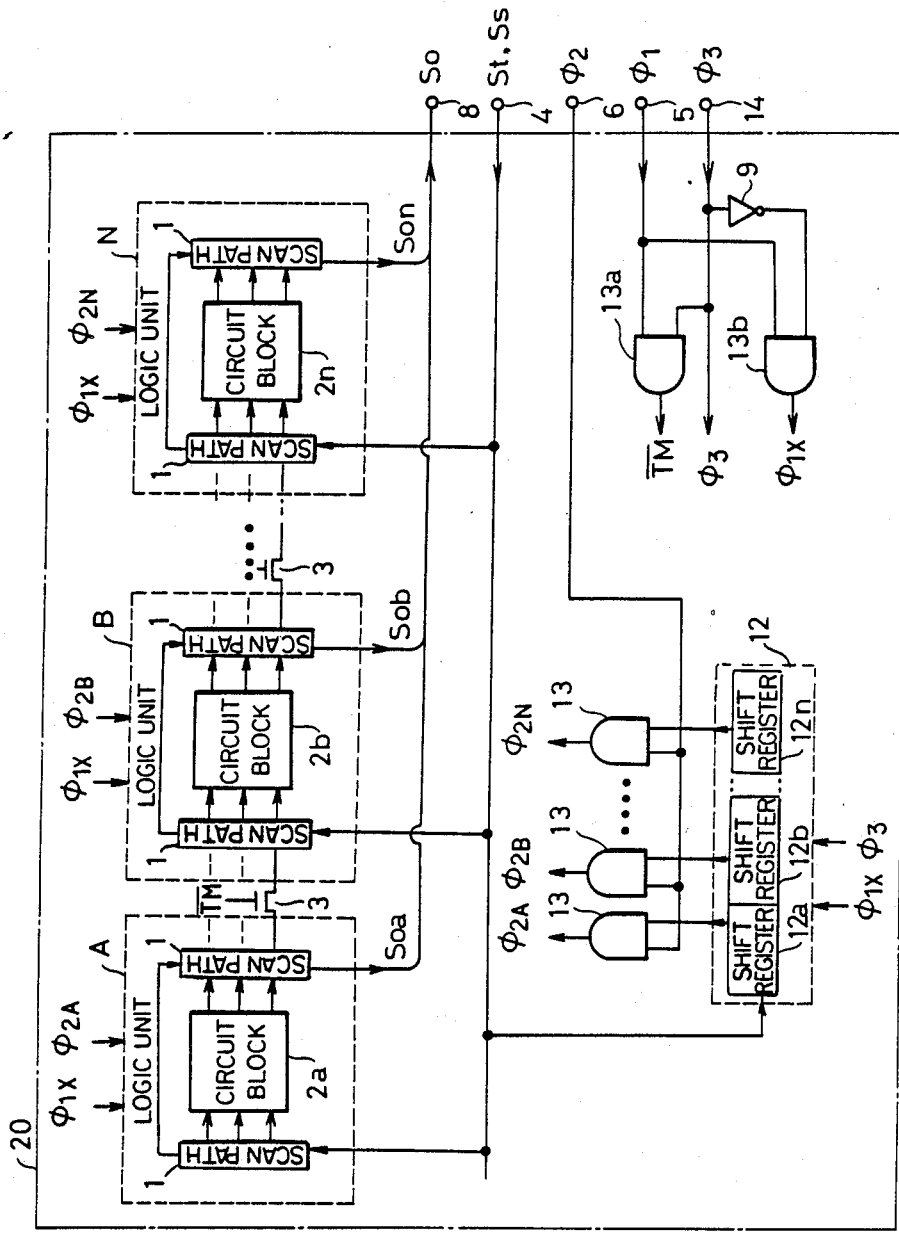
FIG. 9 is a block diagram of a semiconductor IC according to another embodiment of the present invention which includes a plurality of tested circuits.

FIG. 9 is a block diagram of a semiconductor IC including a plurality of circuit blocks to be tested fabricated in accordance with the present invention.

The semiconductor IC 20 of FIG. 9, different from the one shown in FIG. 5, includes a circuit comprising ANd gates 13a and 13b and an inverter 9. This circuit produces, internally of the IC 20, a clock signal $\phi_{1X}$ which is used in place of $\phi_1$ and has the same phase as $\phi_1$, and also the test mode signal $\overline{TM}$. Accordingly, the IC of FIG. 9 does not have a terminal corresponding to the test mode control terminal 7 of the circuit of FIG. 5.

Now, operation of the semiconductor IC of FIG. 9 is explained.

Figure 10:
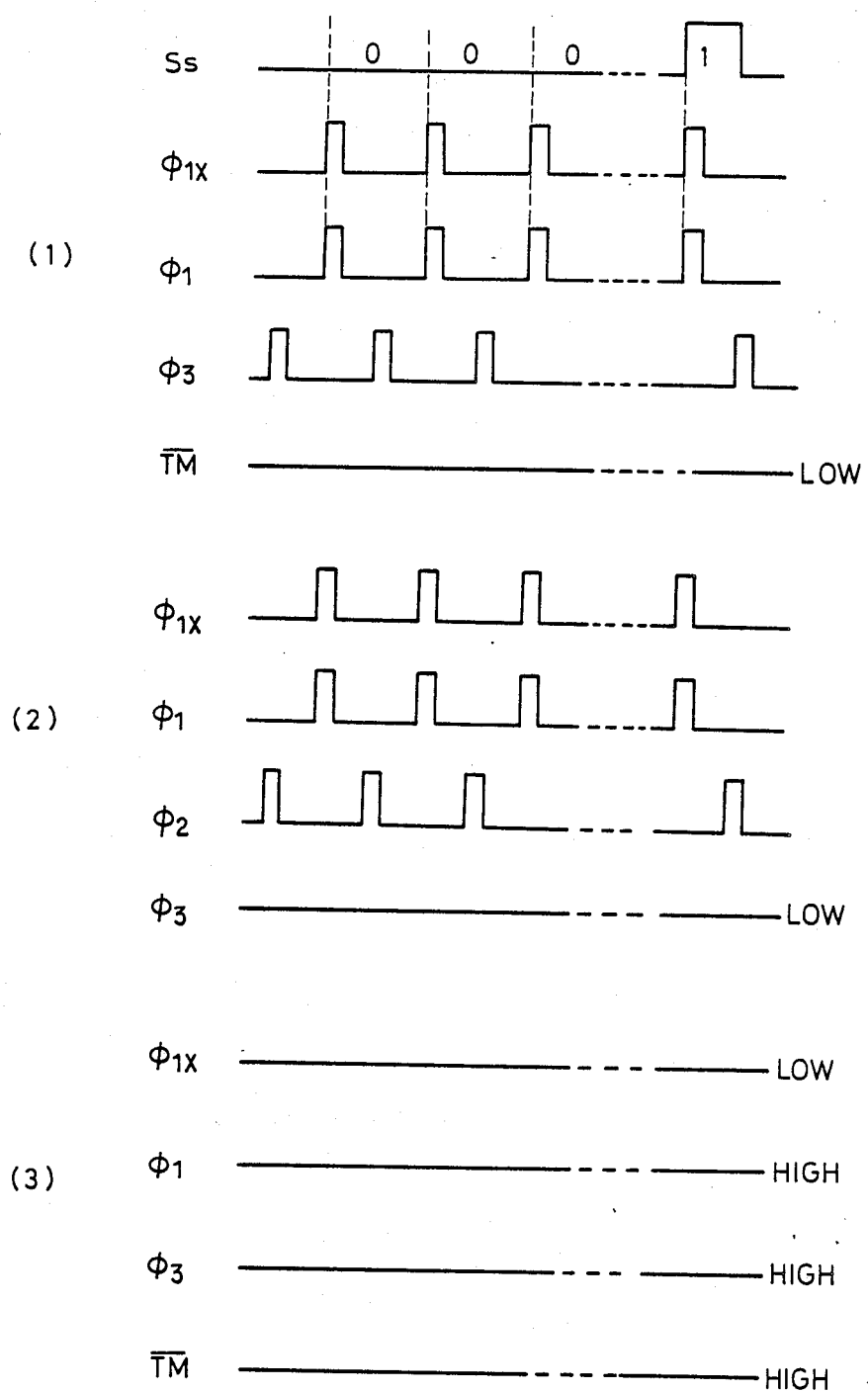
FIG. 10 shows waveforms of various signals for aiding in understanding the shift register selecting operation, the test mode of operation and the normal mode of operation of the semiconductor IC of the present invention shown in FIG. 9.

During the scan-path selection in the test mode, clock signals $\phi_1$ and $\phi_3$ such as shown in FIG. 10(1) are applied to the input terminals 5 and 14, respectively. Then, the AND gate 13a produces at its output the test mode signal $\overline{TM}$ at a low level, and the AND gate 13b produces at its output the clock signal $\phi_{1X}$ which is in phase with the clock signal $\phi_1$. The clocksignal $\phi_{1X}$ is applied to the register 12 and to the respective scan-paths 1. At the same time, the selection signal $S_s$ is applied through the input terminal 4 for selecting the scan-paths 1 to which the clock signal $\phi_2$ is to be applid. This selection operation is identical with the selection operation already described with reference to FIG. 5.

During the test, the clock signals such as shown in FIG. 10(2) are applied, so that the clock signal $\phi_{1X}$ and the clock signal $\phi_2$ which is the output of the selected AND gate 13 are coupled to the selected scan-paths 1. The test data signal $S_t$ is applied through the input terminal 4 for carrying out desired tests. The testing operation is essentially the same as the one in the circuit shown in FIG. 1.

During the normal mode of operation, the clock signals $\phi_1$ and $\phi_3$ are maintained high as shown in FIG. 10(3). This causes the clock signal $\phi_{1X}$ to be at a low level so that no scan-paths can operate. The test mode signal $\overline{TM}$ is at a high level to render the transistors 3 conductive. Accordingly, necessary connections are made between the successive circuit blocks 2a, 2b, ..., 2n, and the normal operation can be performed. The low level clock signal $\phi_{1X}$ does not adversely affect the normal operation of the semiconductor IC 20.

Figure 11:
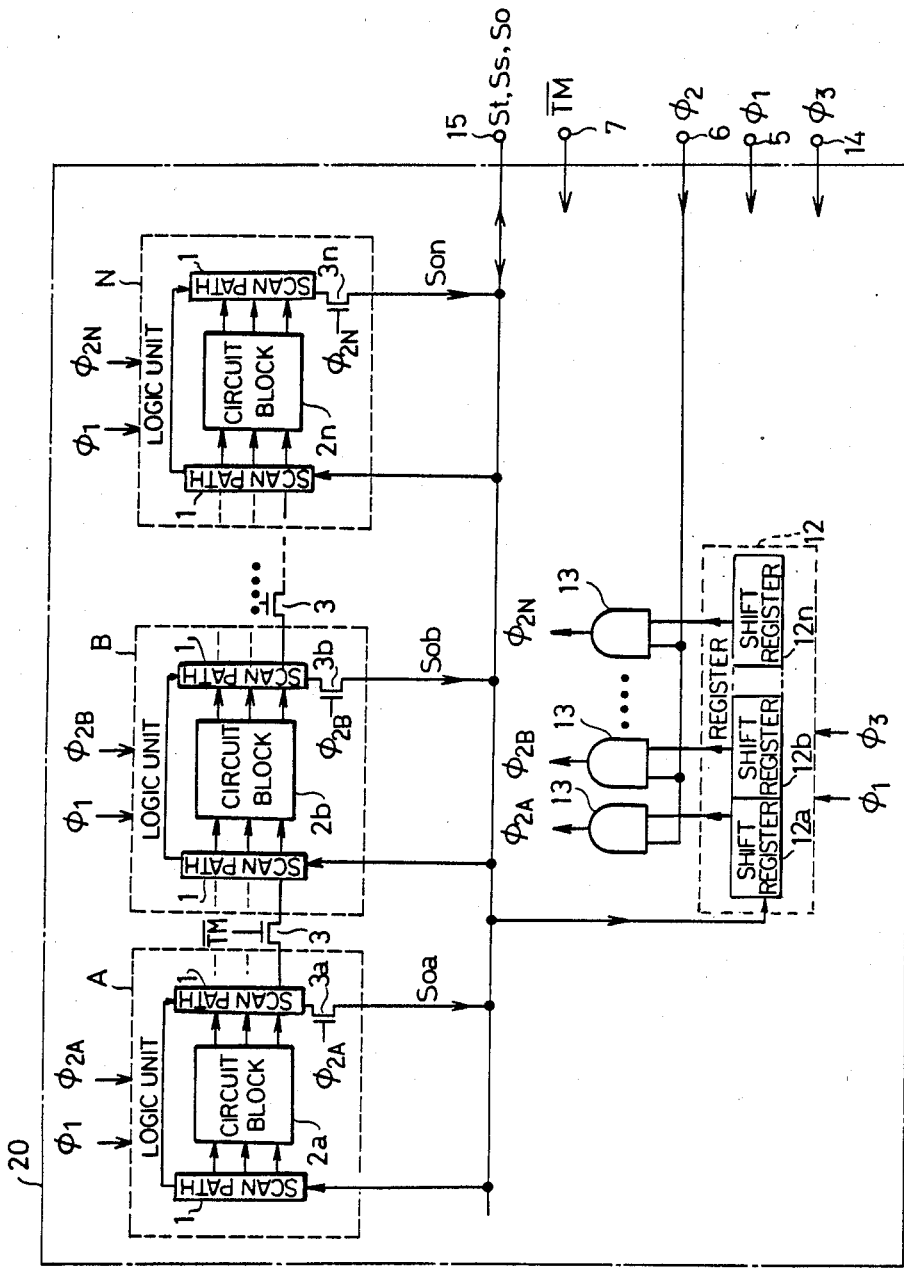
FIG. 11 is a block diagram of a semiconductor IC according to still another embodiment of the present invention including a plurality of tested circuits.

FIG. 11 is a block diagram of a semiconductor IC including a plurality o circuit blocks to be tested, fabricated in accordance with the present invention. The semiconductor IC 20 of FIG. 11 differs from the semiconductor IC in that it includes switching transistors 3a-3n connected between respective ones of the serial outputs of the scan-paths connected at the outputs of the circuit blocks 2a-2n and a serial output terminal 15, and that the serial input terminal 15 is used also as a serial output terminal. The transistors 3a through 3n may be, for example, N channel (or P channel) insulated gate field effect transistors, which are connected to receive the clock signals $\phi_{2A}$-$\phi_{2N}$, respectively. The transistors 3a-3n form a selector circuit for selecting one of serial output signals $S_{oa}$-$S_{on}$ from the scan-paths. The use of the output terminal of this selector circuit also as the serial input terminal avoids increase in number of the serial output terminals even when the number of the circuit blocks 2a-2n is increased.

In the embodiments described, a register of the type comprising shift registers including ratio-type latch circuits is used as the register 12, but any other suitable register can be used.

It should be understood that the embodiments described in the above with reference to the drawings are only examples, that the present invention is not limited to the described embodiments, and that various modifications are possible.

What is claimed is:

1. A semiconductor integrated circuit, comprising:
   clock input means for receiving externally applied clock signals;
   a plurality of tested circuits subject to logic tests;
   test data signal input means for receiving a externally applied test data signal for testing said plurality of tested circuits; and
   a plurality of shift register means forming pairs, one of said shift register means in each pair being coupled to the input of the associated one of said plurality of tested circuits, with the other shift register means being coupled to the output of said associated one of said plurality of tested circuits, said plurality of shift register means performing shifting operation in response to clock signals applied thereto via said clock input means;
   wherein:
   each of said shift register means coupled to the inputs of said tested circuits is coupled to said test data signal input means and responsive to clock signals applied thereto via said clock input means by applying the test data signal to the tested circuit to which that shift register means is coupled, and each of said shift register means coupled to the outputs of said tested circuits is responsive to clock signals applied thereto via said clock input means by providing a test result representative signal after the completion of testing the tested circuit to which that shift register is coupled; and
   said semiconductor integrated circuit further comprises:
   selection signal input means for receiving an externally applied selection signal for selecting that pair of shift register means to which clock signals applied via said clock input means are to be applied; and
   clock signal selective application means coupled to said clock input means and to said selection signal input means and responsive to the selection signal provided via said selection signal input means for selectively applying clock signals applied at said clock input means to that pair of shift register means which is designated by said selection signal.

2. A semiconductor integrated circuit, comprising:
clock input means for receiving externally applied clock signals;
a plurality of tested circuits subject to logic tests;
test data signal input means for receiving a externally applied test data signal for testing said plurality of tested circuits;
mode control signal inputs means for receiving externally applied test mode control signal for said tested circuits;
common output means from which a result of test on the tested circuit is externally derived; and
a plurality of shift register means forming pairs, one of said shift register means in each pair being coupled to the input of the associated one of said plurality of tested circuits, with the other shift register means being coupled to the output of said associated one of said plurality of tested circuits, said plurality of shift register means performing shifting operation in response to clock signals applied thereto via said clock input means;
wherein:
each of said shift register means coupled to the inputs of said tested circuits is coupled to said test data signal input means and responsive to clock signals applied thereto via said clock input means by applying the test data signal to the tested circuit to which that shift register means is coupled, and each of said shift register means coupled to the outputs of said tested circuits is responsive to clock signals applied thereto via said clock input means by providing a test result representative signal after the completion of testing the tested circuit to which that shift register is coupled; and
said semiconductor integrated circuit further comprises:
selection signal input means for receiving an externally applied selection signal for selecting that pair of shift register means to which clock signals applied via said clock input means are to be applied; and
clock signal selective application means coupled to said clock input means and to said selection signal input means and responsive to the selection signal provided via said selection signal input means for selectively applying clock signals applied at said clock input means to that pair of shift register means which is designated by said selection signal.

3. The semiconductor integrated circuit according to claim 2, wherein said plurality of tested circuits are coupled in series; and the shift register means coupled to the output of each of said tested circuits is coupled to the shift register means coupled to the input of the next succeeding tested circuit by means of one or more switching elements which are ON-OFF controlled by said mode control signal.

4. The semiconductor integrated circuit according to claim 1, wherein said clock signal selective application means comprises:
a register comprising serially connected shift registers equal in number to said tested circuits, and having input means for receiving the selection signal and output means from respective ones of said shift registers, said register receiving first and second clock signals for shifting said selection signal applied thereto; and
AND gates equal in number to said tested circuits, each having first input means coupled to the output means of an associated one of said shift registers and second input means for receiving a third clock signal, the outputs of the respective ones of said AND gates being applied as one clock signal for said shift register means coupled to the inputs and outputs of said tested circuits.

5. The semiconductor integrated circuit according to claim 2, wherein a switching element is connected between the serial output of said shift register means coupled to the output of each of said plurality of tested circuits and said test result deriving common output means, said switching elemens being closed one at a time.

6. A semiconductor integrated circuit, comprising:
three clock input means for receiving externally applied first, second and third clock signals, respectively;
a plurality of tested circuits subject to logic tests;
test data signal input means for receiving a externally applied test data signal for testing said plurality of tested circuits;
a plurality of shift register means forming pairs, one of said shift register means in each pair being coupled to the input of the associated one of said plurality of tested circuits, with the other shift register means being coupled to the output of said associated one of said plurality of tested circuits, said plurality of shift register means performing shifting operation in response to clock signals applied thereto via said clock input means; and
one or more switching elements connecting the shift register means coupled to the output of each of said tested circuits to the shift register means coupled to the input of the succeeding tested circuit, said switching elements being ON-OFF controlled by said mode control signal;
wherein:
each of said shift register means coupled to the inputs of said tested circuits is coupled to said test data signal input means and responsive to clock signals applied thereto via said clock input means by applying the test data signal to the tested circuit to which that shift register means is coupled, and each of said shift register means coupled to the outputs of said tested circuits is responsive to clock signals applied thereto via said clock input means by providing a test result representative signal after the completion of testing the tested circuit to which that shift register is coupled; and
wherein:
said semiconductor integrated circuit further comprises:
selection signal input means for receiving an externally applied selection signal for selecting that pair of shift register means to which clock signals applied via said clock input means are to be applied;
clock signal selective application means coupled to said clock input means and to said selection signal input means and responsive to the selection signal provided via said selection signal input means for selectively applying clock signals applied at said clock input means to that pair of shift register means which is designated by said selection signal;
a first AND gate having inputs for receiving first and second clock signals, respectively;

a second AND gate having inputs for receiving said first clock signal and the inverted version of said second clock signal, respectively;

means for coupling the output of said first AND gate to said one or more switching elements; and means for applying the output of said second AND gate as one clock signal for said clock signal selective application means and for said respective shift register means.

7. A method of testing a semiconductor integrated circuit comprising clock input means for receiving externally applied clock signals, a plurality of tested circuit subject to logic test, test data input means for receiving an externally applied test data signal for testing said plurality of tested circuits, output means from which a test result representative signal is derived, a plurality of shift registers coupled to the inputs of said respective tested circuits and a plurality of shift registers coupled to the outputs of said respective tested circuits, said shift registers performing shifting operation in response to clock signals applied thereto via said clock input means, and clock signal selective application means coupled to the shift registers coupled to the inputs of said tested circuits and comprising a register and a gate circuit, said method comprising the steps:

externally applying a shift register selection signal to said clock signal selective application means for selecting only those shift registers which are coupled to the input and output of a particular tested circuit to be tested;

applying to the one of said selected shift registers coupled to the input of said particular tested circuit, a test data signal and clock signals for causing shifting operation in said one shift register; and after the completion of testing said particular tested circuit, deriving the test result through the shift register coupled to the output of said particular tested circuit.

8. The method of testing a semiconductor integrated circuit, according to claim 7, wherein said steps are carried out for each of said tested circuits.

* * * * *